United States Patent

Wagner

[11] Patent Number: 5,179,366
[45] Date of Patent: Jan. 12, 1993

[54] END TERMINATED HIGH POWER CHIP RESISTOR ASSEMBLY

[75] Inventor: Robert Wagner, Mesa, Ariz.

[73] Assignee: Motorola, Inc., Schaumburg, Ill.

[21] Appl. No.: 720,034

[22] Filed: Jun. 24, 1991

[51] Int. Cl.⁵ .................... H01C 1/08; H01C 1/012
[52] U.S. Cl. .................... 338/313; 338/51; 338/308; 338/309; 338/314; 338/332
[58] Field of Search ............... 338/313, 314, 332, 51, 338/309, 308

[56] References Cited

U.S. PATENT DOCUMENTS

| | | | |
|---|---|---|---|
| 4,196,411 | 4/1980 | Kaufman | 338/314 |
| 4,529,958 | 7/1985 | Person et al. | 338/332 X |
| 4,792,781 | 12/1988 | Takahashi et al. | 338/308 |
| 4,829,553 | 5/1989 | Shindo et al. | 338/309 |
| 4,927,697 | 5/1990 | IHill | 338/332 X |
| 5,111,179 | 5/1992 | Flassayer et al. | 338/313 |

Primary Examiner—Marvin M. Lateef
Attorney, Agent, or Firm—Joe E. Barbee

[57] ABSTRACT

An end terminated high power chip resistor-printed circuit board assembly (9) suitable for use in applications requiring miniature surface mount resistors capable of high power dissipation. An end terminated high power chip resistor (8) is constructed by coating a portion of the bottom of an end terminated chip resistor with a conductive plate (12). The end terminated high power chip resistor (8) is mounted to a printed circuit board having at least one via (23) lined with metal (20) wherein the conductive plate (12) is positioned above the via (23) lined with metal (20). A heat sink (16) is mounted to the printed circuit board opposite to the side to which the end terminated high power chip resistor (8) is mounted and is in contact with the metal (20) lining via (23).

8 Claims, 1 Drawing Sheet

END TERMINATED HIGH POWER CHIP RESISTOR ASSEMBLY

BACKGROUND OF THE INVENTION

This invention relates, in general to end terminated chip resistors, and more particularly to a high power end terminated chip resistor-printed circuit board assembly.

End terminated chip resistors are small lead-less elements that have been manufactured in a multitude of highly precise values. These resistors have been used extensively in surface mount hybrid circuits where their small package size affords significant savings in printed circuit board space. Moreover, the electrical performance of circuits employing chip resistors is improved since parasitic inductances and capacitances associated with resistor leads are eliminated. In addition, the leadless feature of these components makes them extremely useful in applications requiring a controlled impedance environment.

Typically, chip resistors have been built by bonding a resistive film to a rectangular shaped ceramic substrate. Electrical contact to the resistive film has been made by a metal coating at each end of the film. The metal coating also covers the ends of the ceramic substrate. The primary purpose of the ceramic substrate is to provide structural support for the resistive film. Collectively, the resistive film, the ceramic substrate, and the metal coating are referred to as the end or wraparound terminated chip resistor.

In most cases, valuable board space is conserved by mounting the end terminated chip resistor directly to bond pads on the printed circuit board. Further, direct mounting has the added benefits of lower cost as well as higher structural reliability and lower parasitic effects owing to the elimination of expensive gold wire interconnects. The primary disadvantage of this method is that the major heat dissipation path is through the surface of the chip resistor to its end terminations. As an example, end terminated chip resistors mounted in this fashion are nominally derated to zero watts at 125° C.; further, a resistor of this type with a length of 2.03 millimeters and a width of 1.27 millimeters is rated at 100 milliwatts at 70° C.

In many applications, thermal dissipation, rather than board space, is the overriding concern in printed circuit board design. To address this issue designers have developed boards with metal lined vias that contact the ceramic substrate of the end terminated chip resistor and have referred to these boards as chip resistor boards in a wire bond configuration. In addition the metal lined vias contact a heat sink. Thus, heat is conducted from the chip resistor to the heat sink through the metal lined via. However, this design requires gold wire interconnects to make electrical contact between the end terminated chip resistor and the signal traces on the printed circuit board. Therefore, not only is board space sacrificed but structural reliability and signal integrity are potentially compromised for improved thermal performance. In this configuration resistors with a length of 2.03 millimeters and a width of 1.27 millimeters are nominally derated to 750 milliwatts at 125° C. Further, at the 70° C. rating there is a seven fold improvement in power rating over the structure in which the end terminated chip resistor is mounted directly to the printed circuit board. Accordingly, it would be beneficial to have an end terminated high power chip resistor-assembly capable of increased power dissipation without compromising board space.

SUMMARY OF THE INVENTION

Briefly stated, the present invention has an end terminated high power chip resistor-assembly consisting of an end terminated chip resistor with a conductive plate mounted to a portion of the substrate, a printed circuit board with at least one metal lined via, and a heat sink. The conductive plate of the chip resistor is mounted over a metal lined via on the printed circuit board. The heat sink is mounted to the printed circuit board on the side opposite to the side to which the end terminated chip resistor is mounted.

DETAILED DESCRIPTION OF THE DRAWINGS

Standard end terminated chip resistors (not shown) are rectangular shaped surface mount elements. Each standard chip resistor has a specified power rating that is a function of the size of the chip resistor. As an example, a standard end terminated chip resistor with a length of 3.05 millimeters and a width of 1.52 millimeters has a power rating of 125 milliwatts at 70° C., and is derated to zero milliwatts at 125° C.

Figure 1:
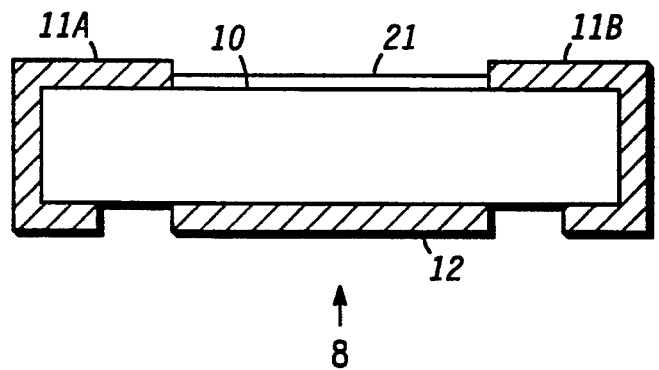
FIG. 1 is a cross-sectional view of an embodiment of an end terminated high power chip resistor in accordance with the present invention.

An end terminated high power chip resistor 8 is a modified version of the standard end terminated chip resistor but with a higher power rating. A cross-sectional view of end terminated high power chip resistor 8 is illustrated in FIG. 1. End terminated high power chip resistor 8 having a length of 3.05 millimeters and a width of 1.40 millimeters has a power rating of greater than two watts at 70° C. and over one watt at 125° C.; a sixteen fold improvement in power rating over the standard end terminated chip resistor with similar dimensions. Thus, for the purposes of this application, an end terminated "high power" chip resistor is defined as one having a power rating at least a factor of ten greater than that of a standard end terminated chip resistor at 70° C.

Chip resistor 8 has a rectangular shaped ceramic substrate 10. In a preferred embodiment ceramic substrate 10 is alumina. A resistive material or film 21 is deposited over a portion of one side of ceramic substrate 10 commonly called the top side. A conductive material 11A and 11B is deposited over each end of ceramic substrate 10 wherein the conductive material functions as the resistor electrodes. In a preferred embodiment, resistive material 21 is ruthenium oxide and conductive material 11A and 11B is a silver-platinum alloy. Conductive material 11A is bonded to one end of resistive material 21, and conductive material 11B is bonded to the end of resistive material 21 opposite to the end to which conductive material 11A is bonded. Conductive material 11A forms a continuous structure from the portion bonded to resistive material 21, around an end of ceramic substrate 10, and overlapping a portion of the bottom side of ceramic substrate 10. Likewise, conductive material 11B forms a continuous structure from the portion bonded to resistive material 21, around an end of ceramic substrate 10, and overlapping a portion of the bottom side of ceramic material 10. Resistive material 21 and conductive material 11A and 11B form the electrically resistive portion of chip resistor 8, whereas ceramic substrate 10 serves to provide structural support for resistive material 21 and conductive material 11A and 11B.

A conductive plate 12 is bonded to a portion of the bottom side of ceramic substrate 10. Conductive plate 12 serves as a conduit for removing heat from resistive material 21. Heat transfer is facilitated by conductive plate 12, electrodes 11A and 11B, as well as resistive material 21 and ceramic substrate 10. Note that electrodes 11A and 11B are not in contact with heat conductive plate 12, thereby providing electrical isolation between plate 12 and electrodes 11A and 11B.

Figure 2:
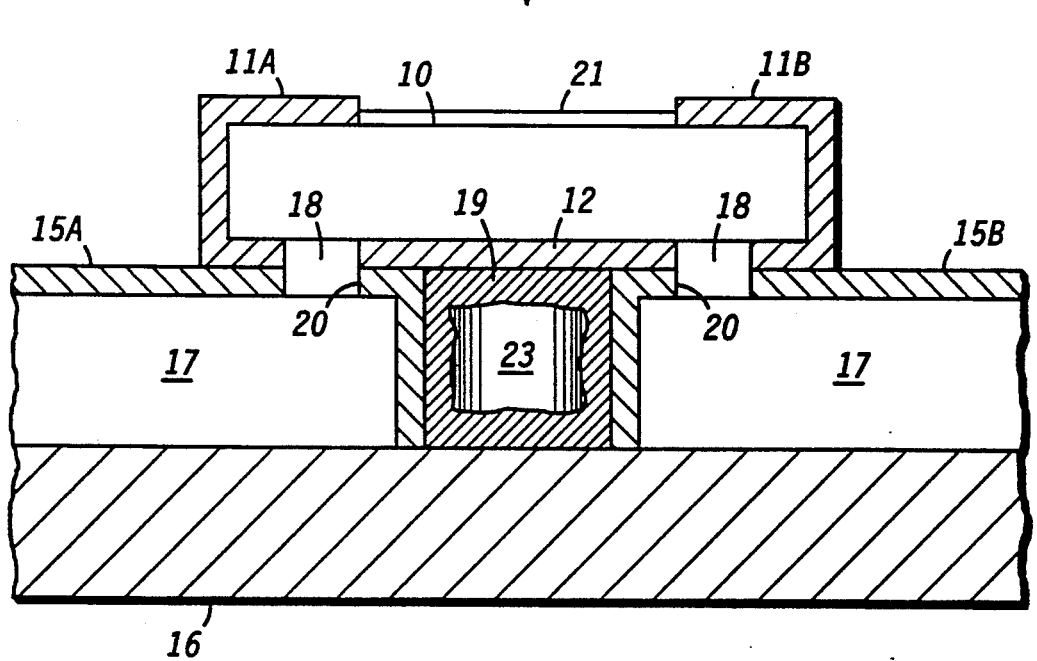
FIG. 2 is a cross-sectional view of an embodiment of an end terminated high power chip resistor-printed circuit board assembly.

FIG. 2 is a cross-sectional view of an end terminated high power chip resistor-printed circuit board assembly 9. Resistor-board assembly 9 has a printed circuit board which comprises a dielectric material 17, at least one via 23 lined with a metal 20, and at least one set of electrically conductive signal traces 15A and 15B on the top side of the printed circuit board. Additionally, resistor-board assembly 9 has a heat sink 16 mounted to the bottom side of the printed circuit board. In a preferred embodiment, dielectric material 17 is a bismaleimide triazine epoxy and woven glass laminate, capable of withstanding temperatures up to 200° C., and metal 20 lining via 23 is copper.

Resistor-board assembly 9 has chip resistor 8 (shown in FIG. 1) mounted to the top side of the printed circuit board having signal conductors 15A and 15B. Conductive plate 12 is mounted above via 23 and bonded to metal 20 with a solder 19. The primary function of metal 20 is to conduct heat from chip resistor 8 to heat sink 16. An added benefit of lining via 23 with metal 20 is the additional thermal transfer brought about by solder 19. During the process of soldering chip-resistor 8 and heat sink 16 to the printed circuit board excess solder 19 flows into via 23. Solder 19 may or may not completely fill via 23. Since, solder 19 does not wet bare printed circuit board dielectric material 17, the likelihood of completely filling via 23 with solder 19 is very low; however, solder 19 does wet metal 20 thereby promoting flow of solder 19 into via 23 and increasing the probability of solder 19 completely filling via 23. Although the presence of solder in via 23 improves heat conduction, completely filling via 23 maximizes heat flow from conductive plate 12 to heat sink 16 through via 23. In a preferred embodiment, solder 19 is a mixture of tin, lead, and silver in the proportions sixty two percent tin, thirty six percent lead and two percent silver.

Conductive material 11A and 11B of chip resistor 8 are coupled with signal conductors 15A and 15B, respectively. Further, the positioning of chip resistor 8 creates slots 18. Slots 18 isolate signal traces 15A and 15B from conductive plate 12. Slots 18 allow direct coupling of conductive material 11A and 11B to signal conductors 15A and 15B, rather than coupling through gold wire bonds.

By now it should be appreciated that there has been provided an arrangement for increasing the power rating of an end terminated chip resistor. In fact, the end terminated high power chip resistor has a power rating at least ten times greater than the standard end terminated chip resistor. Increased heat dissipation is achieved by adding a heat conductive plate to the bottom of the resistor substrate, and mounting the heat conductive plate on a metal lined via. The metal lined via is in contact with a heat sink.

I claim:

1. A method for increasing thermal conductivity in an end terminated high power chip resistor wherein increased heat dissipation promotes a higher power rating, comprising:
   providing an end terminated high power chip resistor having a conductive plate on a portion of a substrate supporting the resistor;
   mounting the end terminated high power chip resistor on a printed circuit board having at least one metal lined via, wherein the conductive plate is in contact with the metal lined via; and
   mounting a heat sink to the printed circuit board opposite to the side the end terminated resistor is mounted to so the metal lined via conducts heat from the conductive plate to the heat sink.

2. The method for increasing thermal conductivity in the end terminated high power chip resistor of claim 1 wherein mounting the resistor is done by surface mounting the resistor to the printed circuit board.

3. The method for increasing thermal conductivity in the end terminated high power chip resistor of claim 1 further including filling the metal lined via of the printed circuit board with solder wherein the metal lined via can be either completely or partially filled with solder.

4. A thermally conductive resistor assembly comprising:
   an end terminated high power chip resistor having a heat conductive portion;
   a printed circuit board with at least one metal lined via wherein the end terminated resistor is mounted so the metal lined via is in contact with the heat conductive portion; and
   a heat sink placed in contact with the printed circuit board so heat is conducted by the metal lined via from the conductive portion of the end terminated chip resistor to the heat sink.

5. The thermally conductive resistor assembly of claim 4 wherein the resistor has end terminations which are used to surface mount the resistor to the printed circuit board.

6. An end terminated high power chip resistor attached to a printed circuit board, the resistor having a thermally conductive material bonded to its substrate, the thermally conductive material mounted above a printed circuit board via wherein the via is lined with metal and filled with solder, and a heat sink is in contact with the metal lined via.

7. An end terminated high power chip resistor for mounting on a printed circuit board, comprising:
   a resistive film mounted on a supporting substrate;
   contacts wrapped around ends of the supporting substrate and making contact to the resistive film; and
   a heat conductive metal attached to the bottom of the supporting substrate.

8. The end terminated high power chip resistor of claim 7 wherein the printed circuit board has a metal lined via and the end terminated high power chip resistor is mounted on the printed circuit board so that the heat conductive metal is in contact with the metal lined via, and further including a heat sink attached to the bottom of the printed circuit board so heat is conducted from the heat conductive metal through the metal lined via to the heat sink.

* * * * *